(12) United States Patent
Hsieh

(10) Patent No.: US 11,700,710 B2
(45) Date of Patent: Jul. 11, 2023

(54) COOLING LIQUID FLOW CONTROL DEVICE

(71) Applicants: Inventec (Pudong) Technology Corporation, Shanghai (CN); INVENTEC CORPORATION, Taipei (TW)

(72) Inventor: Han Chih Hsieh, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 26 days.

(21) Appl. No.: 17/457,251

(22) Filed: Dec. 1, 2021

(65) Prior Publication Data
US 2023/0136588 A1     May 4, 2023

(30) Foreign Application Priority Data
Nov. 4, 2021 (CN) .......................... 202111300052.7

(51) Int. Cl.
*H05K 7/20*     (2006.01)

(52) U.S. Cl.
CPC ..... *H05K 7/20272* (2013.01); *H05K 7/20263* (2013.01); *H05K 7/20281* (2013.01)

(58) Field of Classification Search
CPC ........... H05K 7/20272; H05K 7/20263; H05K 7/20281
See application file for complete search history.

(56) References Cited

U.S. PATENT DOCUMENTS

| | | | | |
|---|---|---|---|---|
| 5,471,844 A * | 12/1995 | Levi | ......................... | F25D 3/105 |
| | | | | 62/51.1 |
| 6,330,157 B1 * | 12/2001 | Bezama | ................ | H01L 23/473 |
| | | | | 361/689 |
| 6,415,619 B1 * | 7/2002 | Bash | ......................... | G06F 1/20 |
| | | | | 257/E23.098 |
| 7,414,843 B2 * | 8/2008 | Joshi | ..................... | H01L 23/473 |
| | | | | 174/15.1 |
| 7,762,314 B2 * | 7/2010 | Campbell | .................. | F28F 3/12 |
| | | | | 165/80.4 |
| 9,310,859 B2 * | 4/2016 | Barina | ....................... | G06F 1/20 |
| 10,561,040 B1 * | 2/2020 | Lunsman | ............ | H05K 7/20272 |
| 2003/0151130 A1 * | 8/2003 | Cheon | ................... | H01L 23/473 |
| | | | | 257/E23.098 |
| 2010/0012294 A1 * | 1/2010 | Bezama | .............. | H01L 23/3672 |
| | | | | 165/80.4 |

(Continued)

*Primary Examiner* — Abhishek M Rathod
(74) *Attorney, Agent, or Firm* — CKC & Partners Co., LLC

(57) ABSTRACT

A cooling liquid flow control device includes a heat dissipation bottom plate, a fixing holder, a cooling module, and a temperature control element. The heat dissipation bottom plate has a bottom surface configured to be in contact with a heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is disposed in the cavity and is configured to deform based on a temperature of the cooling liquid in the cavity, thereby adjusting a flow rate of the cooling liquid in and out of the cavity.

10 Claims, 8 Drawing Sheets

(56) References Cited

U.S. PATENT DOCUMENTS

| | | | |
|---|---|---|---|
| 2014/0054762 A1* | 2/2014 | Nagaune | H01L 23/473 |
| | | | 257/714 |
| 2017/0094837 A1* | 3/2017 | Joshi | H05K 7/20327 |
| 2018/0039308 A1* | 2/2018 | Moore | G06F 1/206 |
| 2020/0229322 A1* | 7/2020 | Bostick | H05K 7/20772 |
| 2021/0378139 A1* | 12/2021 | Rice | H01L 23/4735 |

* cited by examiner

COOLING LIQUID FLOW CONTROL DEVICE

CROSS-REFERENCE TO RELATED APPLICATION

This application claims priority to China Application Serial Number 202111300052.7, filed Nov. 4, 2021, which is herein incorporated by reference in its entirety.

BACKGROUND

Field of Invention

The present disclosure relates to a cooling liquid flow control device.

Description of Related Art

The water-cooling module of the conventional electronic components (for example, CPU) uses a thermally conductive substrate as the substrate, cooperating with the water inlet side and the water outlet side as the internal circulation loop for heat exchange to achieve the effect of heat dissipation of the electronic component, and utilizes the hole position corresponding to the electronic component platform to perform the fixation on the printed circuit board (PCB).

However, the conventional water-cooling module does not have the function of controlling the flow rate (for example, the flow rate of the cooling water). Since the water-cooling module cannot control the flow rate, the water-cooling module cannot optimize the heat dissipation of the electronic components in the idle or full load state, and thus cannot adjust the electrical load of the CDU to the system.

Therefore, how to propose a cooling liquid flow control device that can solve the aforementioned problems is one of the problems that the industry urgently wants to invest in research and development resources to solve.

SUMMARY

In view of this, one purpose of present disclosure is to provide a cooling liquid flow control device that can solve the aforementioned problems.

In order to achieve the above objective, according to one embodiment of the present disclosure, a cooling liquid flow control device includes a heat dissipation bottom plate, a fixing holder, a cooling module, and a temperature control element. The heat dissipation bottom plate includes a bottom surface configured to be in contact with the heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is disposed in the cavity and is configured to deform based on a temperature of the cooling liquid in the cavity, thereby adjusting a flow rate of the cooling liquid in and out of the cavity.

In one or more embodiments of the present disclosure, the cooling liquid flow control device further includes a liquid inlet pipe and a liquid outlet pipe. The cavity further includes a first sub-cavity and a second sub-cavity. The first sub-cavity is configured to receive the cooling liquid from the liquid inlet pipe. The second sub-cavity surrounds the first sub-cavity and is configured to deliver the cooling liquid from the first sub-cavity to the liquid outlet pipe.

In one or more embodiments of the present disclosure, an opening is between the first sub-cavity and the second sub-cavity, and the opening allows the cooling liquid to circulate between the first sub-cavity and the second sub-cavity.

In one or more embodiments of the present disclosure, the cooling module further includes a top plate, an outer surrounding wall, and an inner surrounding wall. The top plate has a liquid inlet hole and a liquid outlet hole, in which the liquid inlet hole connects the liquid inlet pipe and the first sub-cavity, and the liquid outlet hole connects the liquid outlet pipe and the second sub-cavity. The outer surrounding wall extends vertically from an edge of the top plate and surrounds the edge of the top plate, in which the outer surrounding wall is connected to the heat dissipation bottom plate. The inner surrounding wall extends vertically from the top plate and surrounded by the outer surrounding wall, in which the inner surrounding wall is connected to the heat dissipation bottom plate.

In one or more embodiments of the present disclosure, the opening is located on the inner surrounding wall.

In one or more embodiments of the present disclosure, the temperature control element includes a first metal strip and a second metal strip. The first metal strip has a first coefficient of thermal expansion. The second metal strip is attached to the first metal strip and has a second coefficient of thermal expansion, in which the first coefficient of thermal expansion is less than the second coefficient of thermal expansion.

In one or more embodiments of the present disclosure, the temperature control element further includes a stop portion disposed on the second metal strip, and the stop portion is configured to clog and be separated from the liquid inlet hole.

In one or more embodiments of the present disclosure, an end of the temperature control element away from the stop portion is connected to an inner surface of the cavity.

In one or more embodiments of the present disclosure, the temperature control element is configured to bend toward a side of the second metal strip when the temperature of the cooling liquid is lower than a temperature threshold, so that the stop portion clogs the liquid inlet hole so as not to communicate the liquid inlet pipe and the first sub-cavity.

In one or more embodiments of the present disclosure, the temperature control element is configured to bend toward a side of the first metal strip when the temperature of the cooling liquid is higher than a temperature threshold, so that the stop portion is separated from the liquid inlet hole to communicate the liquid inlet pipe and the first sub-cavity.

In summary, in the cooling liquid flow control device of the present disclosure, since the temperature control element utilizes the characteristics of bimetallic strip generating deformation based on the temperature of the cooling liquid, the stop portion of the temperature control element can clog, partially clog, or be separated from the liquid inlet hole to achieve the purpose of controlling the flow rate of the cooling liquid. In the cooling liquid flow control device of the present disclosure, since the bimetallic strip is used as the material of the temperature control element, it can not only achieve the power saving effect of the cooling liquid flow control device, but also effectively reduce the installation space of the liquid cooling device.

The above-mentioned description is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows.

DETAILED DESCRIPTION

Figure 1:
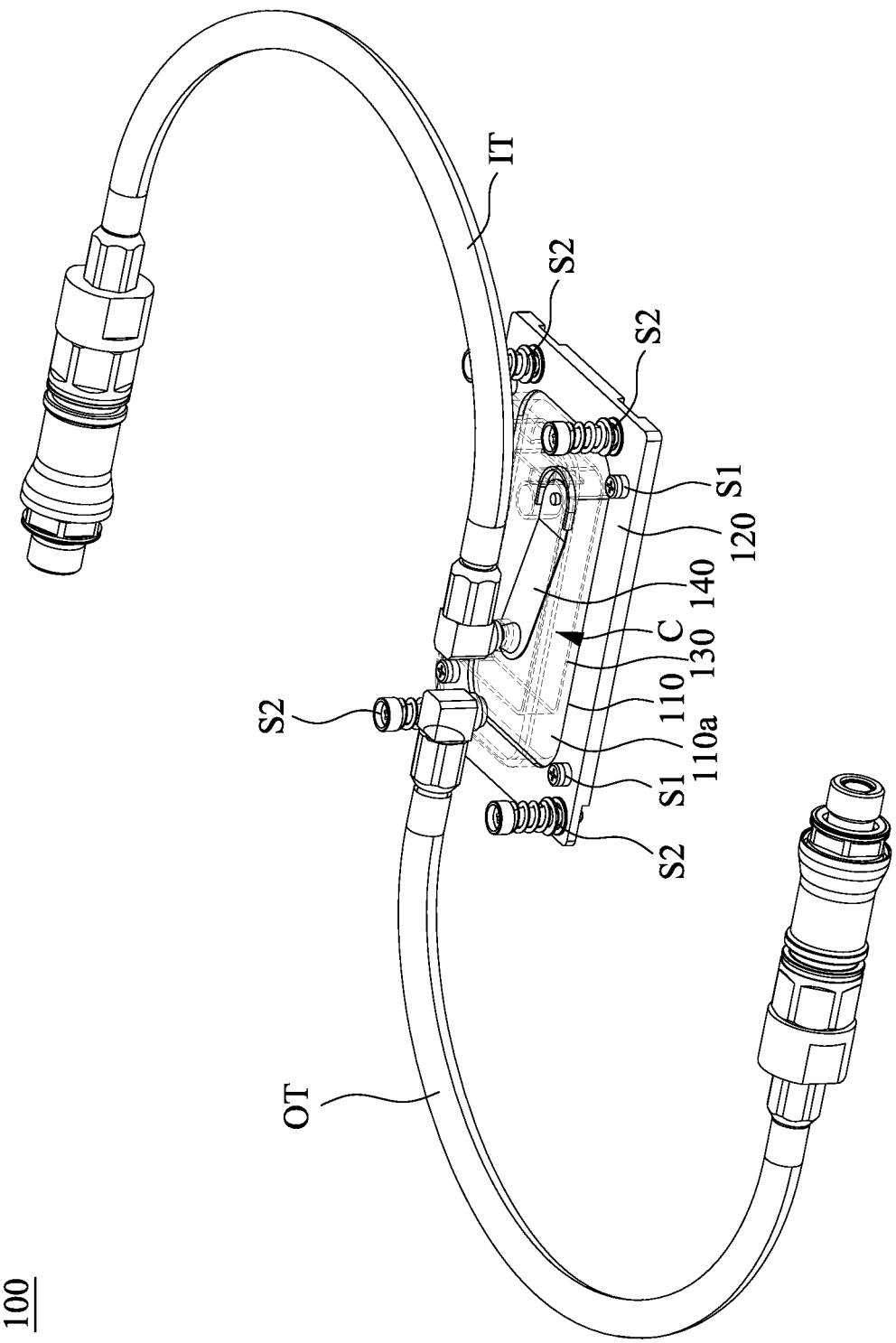
FIG. 1 shows a schematic view of a cooling liquid flow control device, in accordance with an embodiment of present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a cooling liquid flow control device of this embodiment and the connection relationship between the components will be described in detail.

Figure 2:
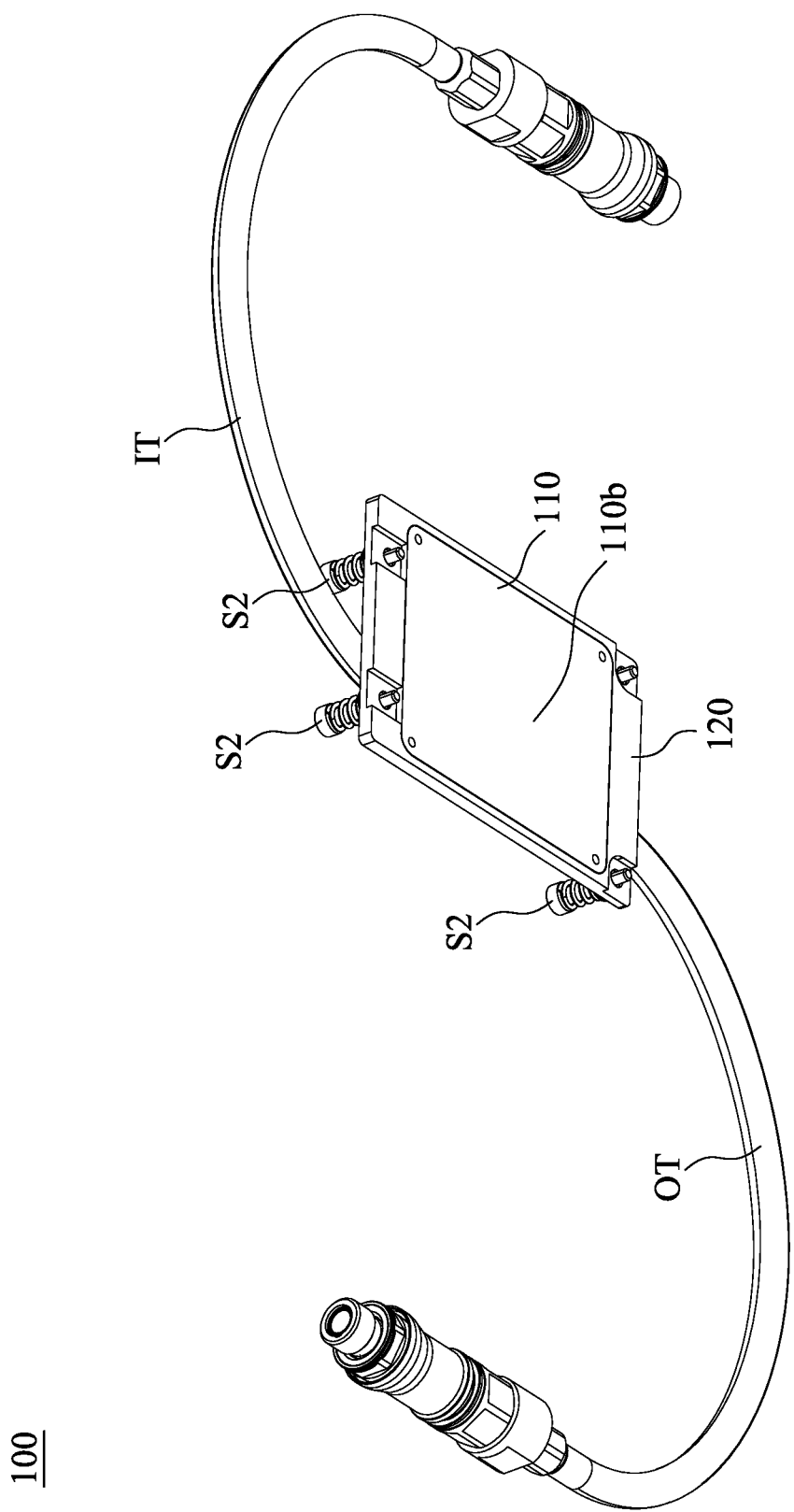
FIG. 2 shows another schematic view of a cooling liquid flow control device, in accordance with an embodiment of present disclosure.

Reference is made to FIG. 1 and FIG. 2. FIG. 1 and FIG. 2 are schematic views of different visual angles of the cooling liquid flow control device 100 according to an embodiment of the present disclosure. In this embodiment, the cooling liquid flow control device 100 includes a heat dissipation bottom plate 110, a fixing holder 120, a cooling module 130, and a temperature control element 140. The heat dissipation bottom plate 110 has a top surface 110a and a bottom surface 110b. The bottom surface 110b is configured to be in contact with a heating element (not shown; for example, CPU) on a substrate (not shown; for example, PCB). The fixing holder 120 is connected to the heat dissipation bottom plate 110 and configured to be fixed to the substrate. Specifically, as shown in FIG. 1 and FIG. 2, the heat dissipation bottom plate 110 is connected to the fixing holder 120 by the fixing element S1, the heating element is in contact with the bottom surface 110b of the heat dissipation bottom plate 110, and the heating element is located between the heat dissipation bottom plate 110 and the substrate. When the fixing holder 120 is fixed toward the substrate by the fixing element S2, the heat dissipation bottom plate 110 is pressed against the heating element. The cooling module 130 is connected to the top surface 110a of the heat dissipation bottom plate 110 to form a cavity C. The cooling module 130 also includes a liquid inlet pipe IT and a liquid outlet pipe OT. The cavity C is configured to circulate cooling liquid. The temperature control element 140 is disposed in the cavity C and is configured to cause a deformation based on the temperature of the cooling liquid in the cavity C, thereby adjusting the flow rate of the cooling liquid in and out of the cavity C.

Figure 3B:
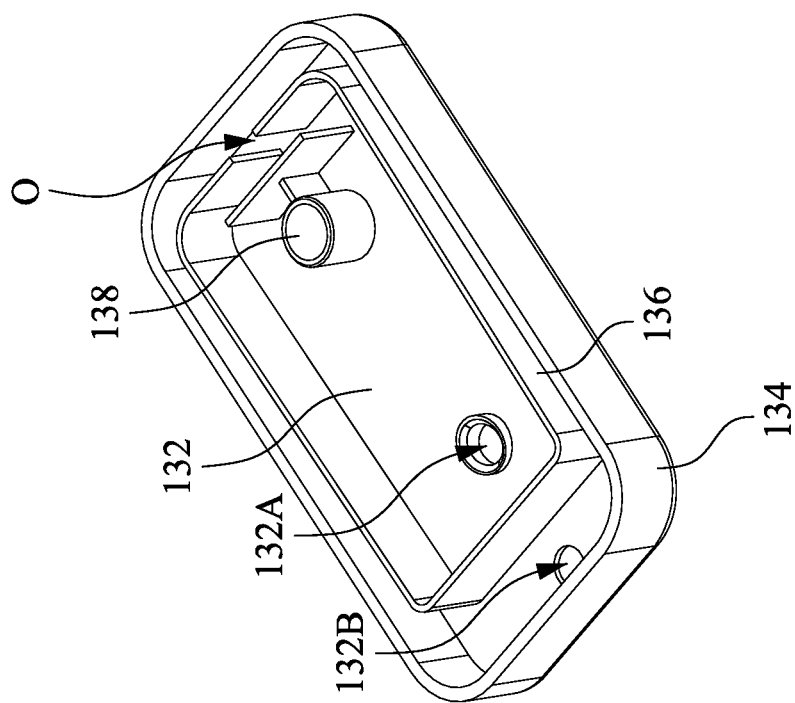
FIG. 3B shows another partial schematic view of a cooling module of a cooling liquid flow control device, in accordance with an embodiment of present disclosure.
Figure 3A:
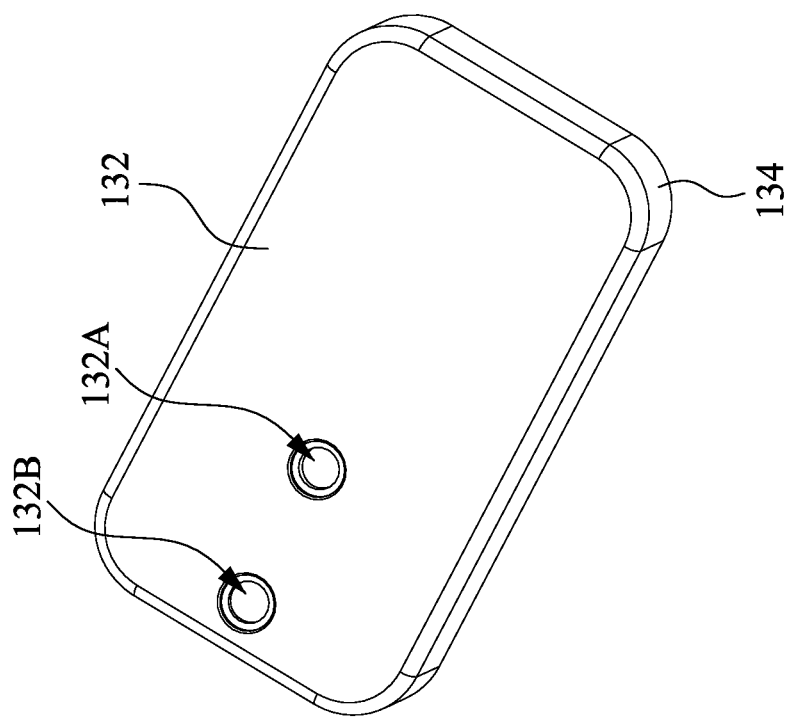
FIG. 3A shows a partial schematic view of a cooling module of a cooling liquid flow control device, in accordance with an embodiment of present disclosure.

Reference is made to FIG. 1, FIG. 3A, and FIG. 3B. In this embodiment, the cooling module 130 includes a top plate 132, an outer surrounding wall 134, an inner surrounding wall 136, and a pressing block 138. The top plate 132 has a liquid inlet hole 132A and a liquid outlet hole 132B, the liquid inlet hole 132A is connected to the liquid inlet pipe IT, and the liquid outlet hole 132B is connected to the liquid outlet pipe OT. The outer surrounding wall 134 extends vertically from the edge of the top plate 132 and surrounds the edge of the top plate 132. The inner surrounding wall 136 extends vertically from the top plate 132 and is surrounded by the outer surrounding wall 134. The inner surrounding wall 136 also has an opening O. The pressing block 138 extends from the top plate 132 and is configured to press against the temperature control element 140 disposed in the cavity C.

Figure 4:
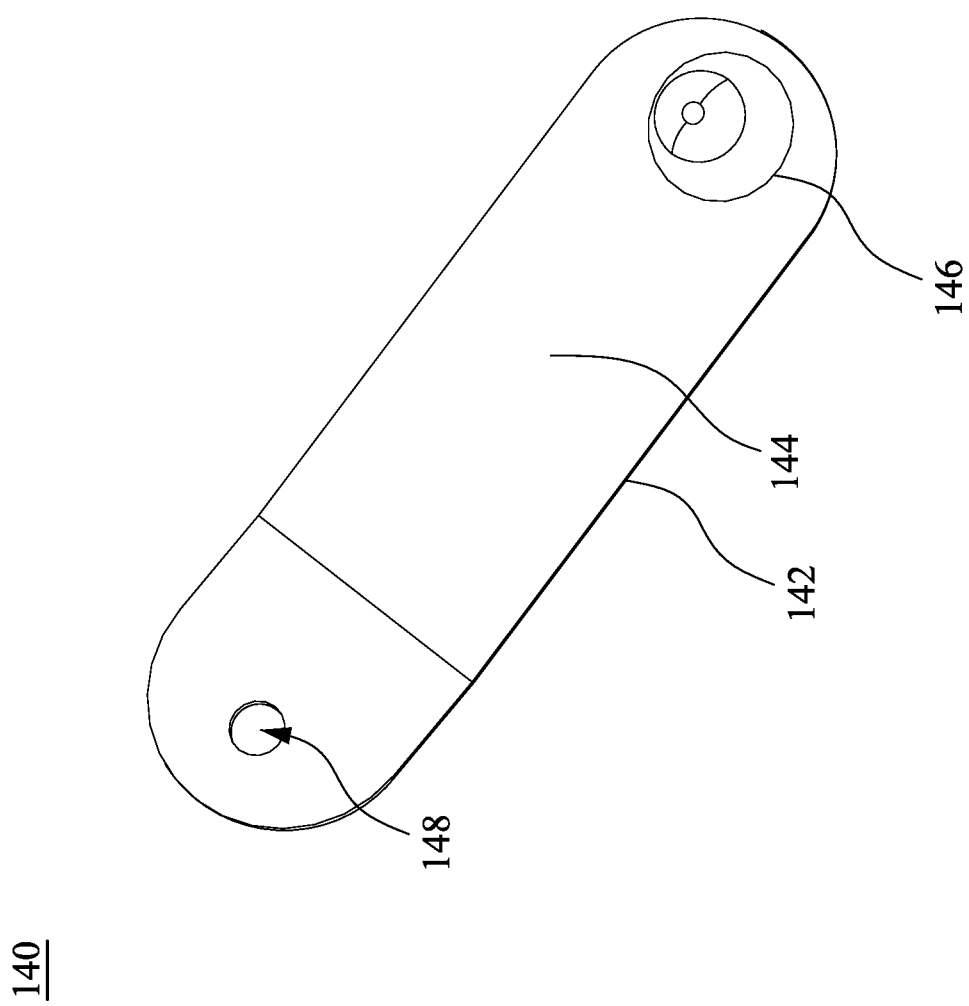
FIG. 4 shows a schematic view of a temperature control element of a cooling liquid flow control device, in accordance with an embodiment of present disclosure.

Please refer to FIG. 1 and FIG. 4, in this embodiment, the temperature control element 140 includes a first metal strip 142, a second metal strip 144, and a stop portion 146. The first metal strip 142 and the second metal strip 144 are attached to each other. In FIG. 4, the size of the first metal strip 142 is substantially the same as the size of the second metal strip 144. Since the first metal strip 142 is located on the back side of the temperature control element 140 in FIG. 4, the first metal strip 142 is not fully revealed. The first metal strip 142 has a first coefficient of thermal expansion, and the second metal strip 144 has a second coefficient of thermal expansion, wherein the first coefficient of thermal expansion is different from the second coefficient of thermal expansion. In some embodiments, the first coefficient of thermal expansion is less than the second coefficient of thermal expansion. The stop portion 146 is disposed on one end of the temperature control element 140, and the stop portion 146 protrudes toward a side of the second metal strip 144. The stop portion 146 is configured to clog and be separated from the liquid inlet hole 132A.

Figure 5:
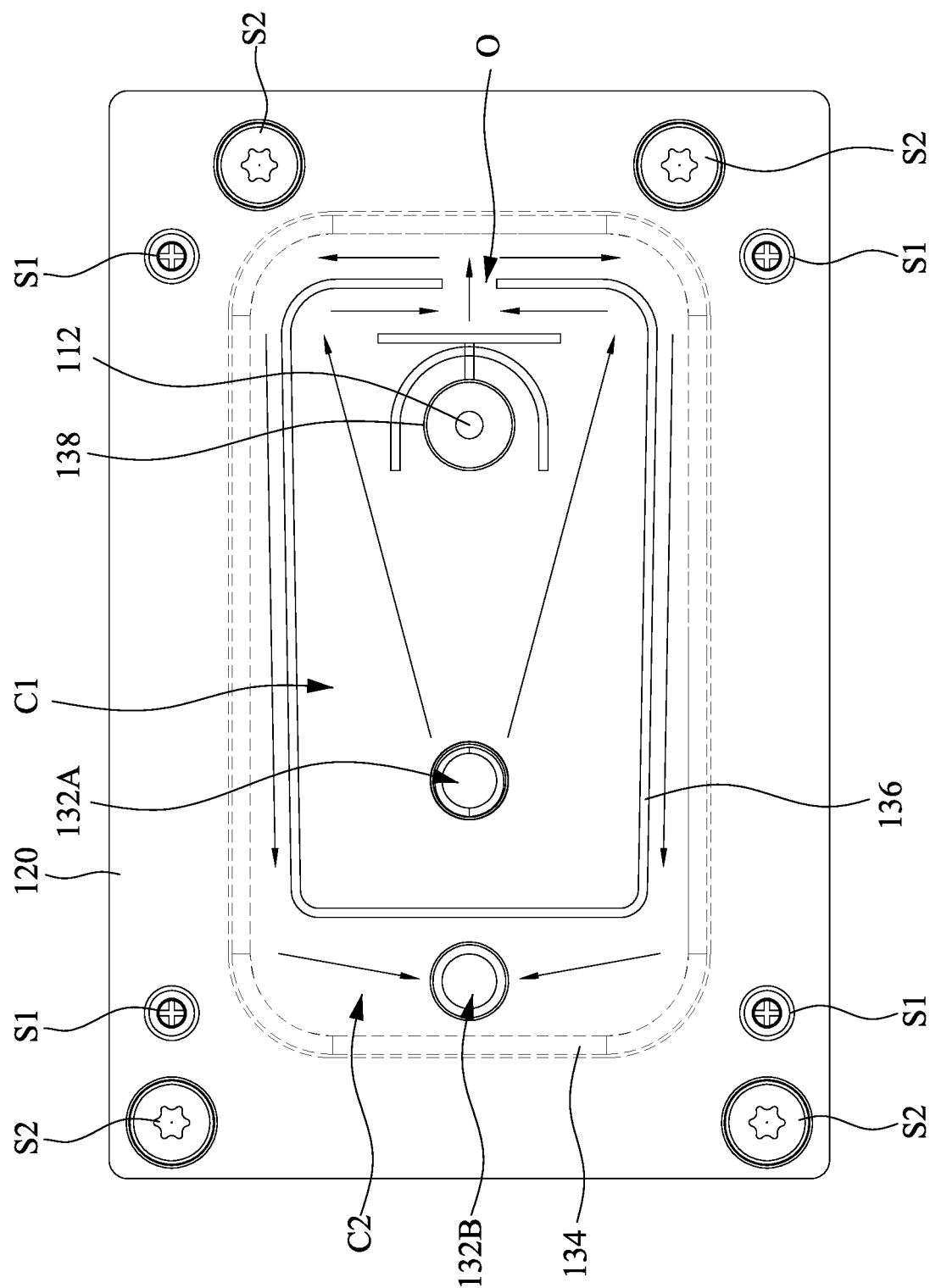
FIG. 5 shows a partial top view of a cooling liquid flow control device, in accordance with an embodiment of present disclosure.
Figure 6:
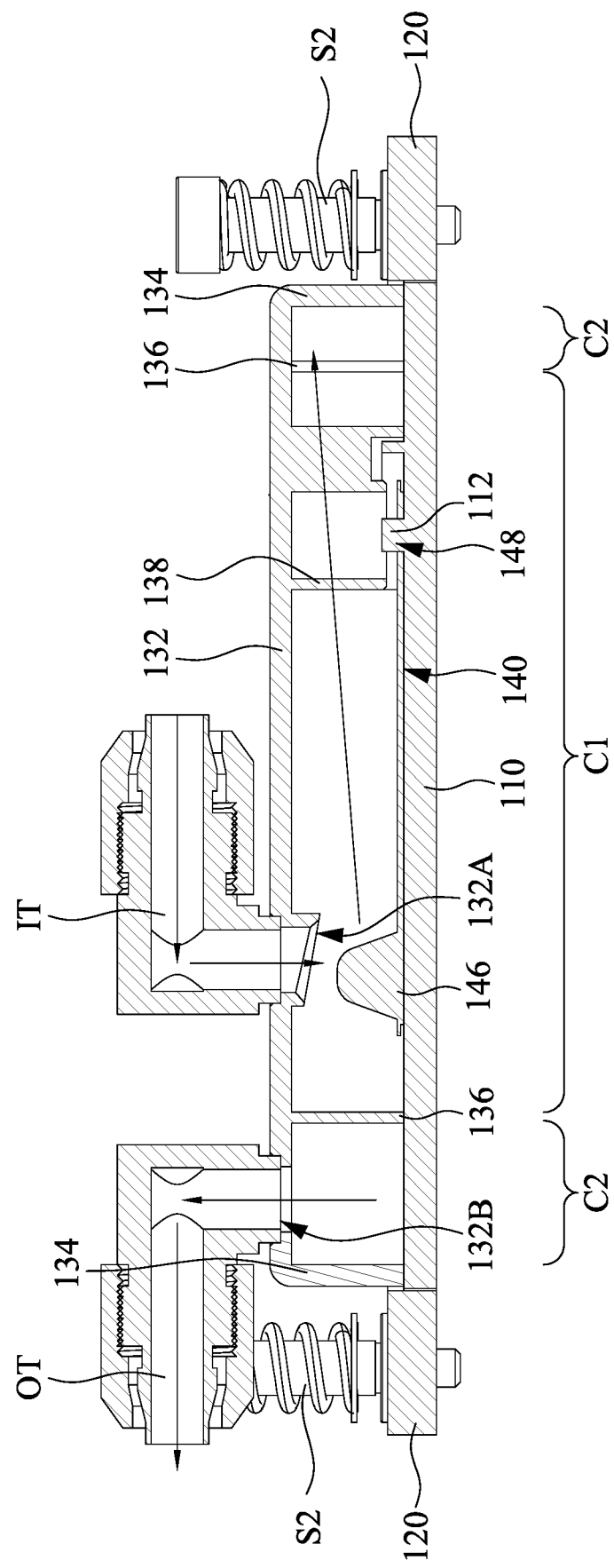
FIG. 6 shows a cross-sectional view of a cooling liquid flow control device, in accordance with an embodiment of present disclosure.

Reference is made to FIG. 1, FIG. 5, and FIG. 6. In this embodiment, the cavity C further includes a first sub-cavity C1 and a second sub-cavity C2. Specifically, as shown in FIG. 5 and FIG. 6, because when the cooling module 130 is connected to the heat dissipation bottom plate 110, the outer surrounding wall 134 and the inner surrounding wall 136 are both connected to the heat dissipation bottom plate 110, so that the top plate 132, the inner surrounding wall 136, and the heat dissipation bottom plate 110 jointly define the first sub-cavity C1, while the top plate 132, the outer surrounding wall 134, the inner surrounding wall 136, and the heat dissipation bottom plate 110 jointly define the second sub-cavity C2. And, the second sub-cavity C2 surrounds the first sub-cavity C1. The first sub-cavity C1 is configured to receive the cooling liquid from the liquid inlet pipe IT, the opening O is configured to allow the cooling liquid to circulate between the first sub-cavity C1 and the second sub-cavity C2. The second sub-cavity C2 is configured to deliver the cooling liquid from the first sub-cavity C1 to the liquid outlet pipe OT. Therefore, the liquid inlet hole 132A is connected to the liquid inlet pipe IT and the first sub-cavity C1, and the liquid outlet hole 132B is connected to the liquid outlet pipe OT and the second sub-cavity C2.

In some embodiments, as shown in FIG. 4, the stop portion 146 is substantially disposed on the second metal strip 144.

In some embodiments, an end of the temperature control element 140 away from the stop portion 146 is substantially connected to the inner surface of the cavity C. For example, as shown in FIG. 4 and FIG. 6, the heat dissipation bottom plate 110 may include a positioning column 112, the temperature control element 140 may include a positioning hole 148, and the positioning hole 148 is located at an end of the temperature control element 140 away from the stop portion 146. In this way, the temperature control element 140 can be positioned on the positioning column 112 by the positioning hole 148, and disposed in the cavity C by the pressing of the pressing block 138.

Please continue to refer to FIG. 5 and FIG. 6. FIG. 5 and FIG. 6 show how the cooling liquid circulates in the cooling liquid flow control device 100, in which the black arrows represent the paths through where the cooling liquid circulates in the cooling liquid flow control device 100. With the aforementioned structural configuration, when the cooling liquid flows into the first sub-cavity C1 from the liquid inlet pipe IT, the cooling liquid enters the first sub-cavity C1 through the liquid inlet hole 132A. Then, the cooling liquid flows into the second sub-cavity C2 located outside the first sub-cavity C1 through the opening O. Then, when the cooling liquid flows into the liquid outlet pipe OT from the second sub-cavity C2, the cooling liquid system enters the liquid outlet pipe OT through the liquid outlet hole 1326.

In some embodiments, the opening O and the liquid outlet hole 132B are respectively close to the opposite sides of the cavity C, so that the cooling liquid can evenly flow through every part of the top plate 132, so that the heat dissipation efficiency may be better. Compared with the case where the opening O and the liquid outlet hole 132B are located on the same side of the cavity C, the cooling liquid flows directly into the liquid outlet pipe OT from the liquid outlet hole 132B through the opening O, and the cooling liquid may not flow through certain parts of the top plate 132, resulting in poor heat dissipation efficiency.

Next, the method of how the cooling liquid flow control device 100 controls the flow rate of the cooling liquid will be discussed.

Figure 7:
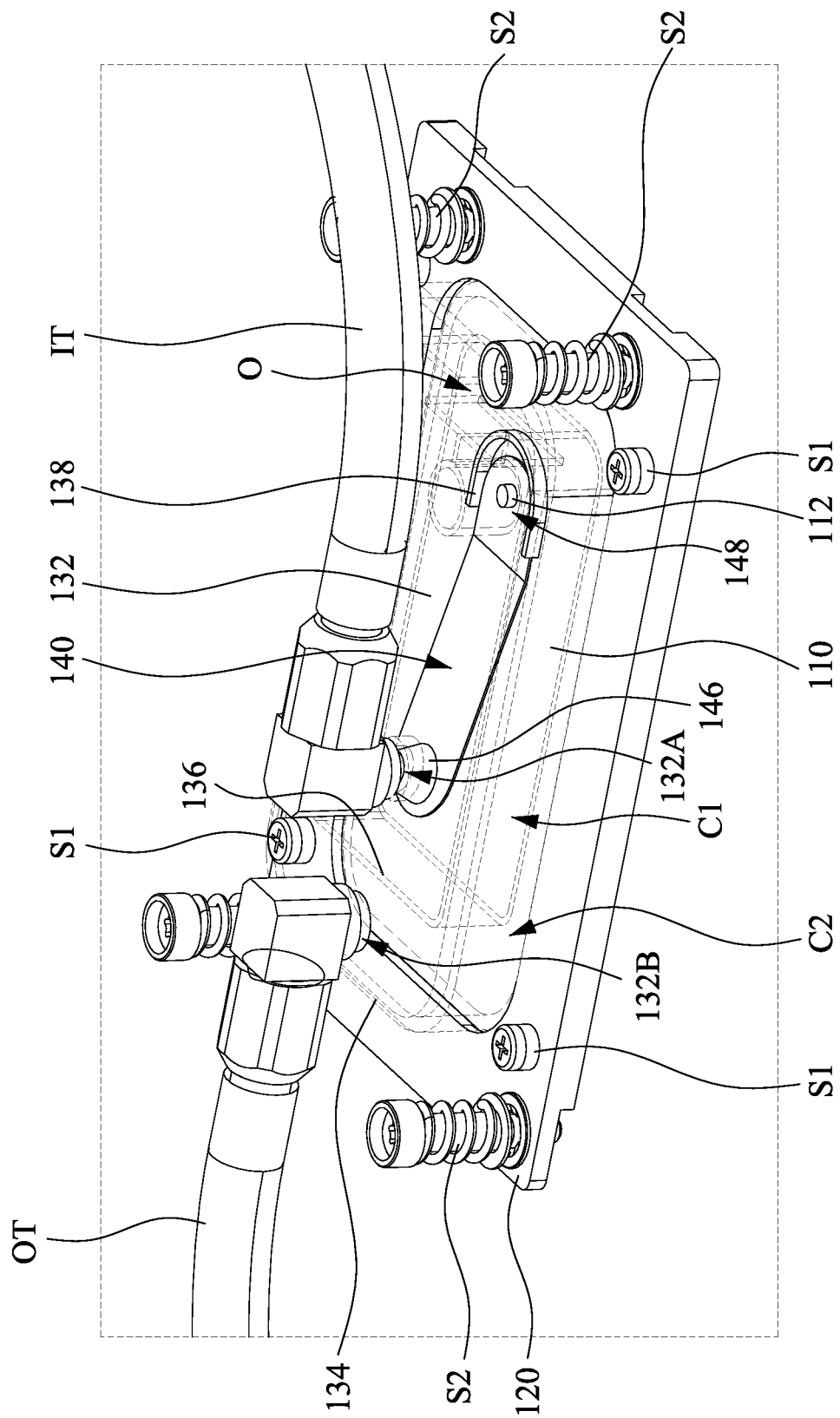
FIG. 7 shows a schematic view of a stop portion clogging a liquid inlet hole, in accordance with an embodiment of present disclosure.
Figure 8:
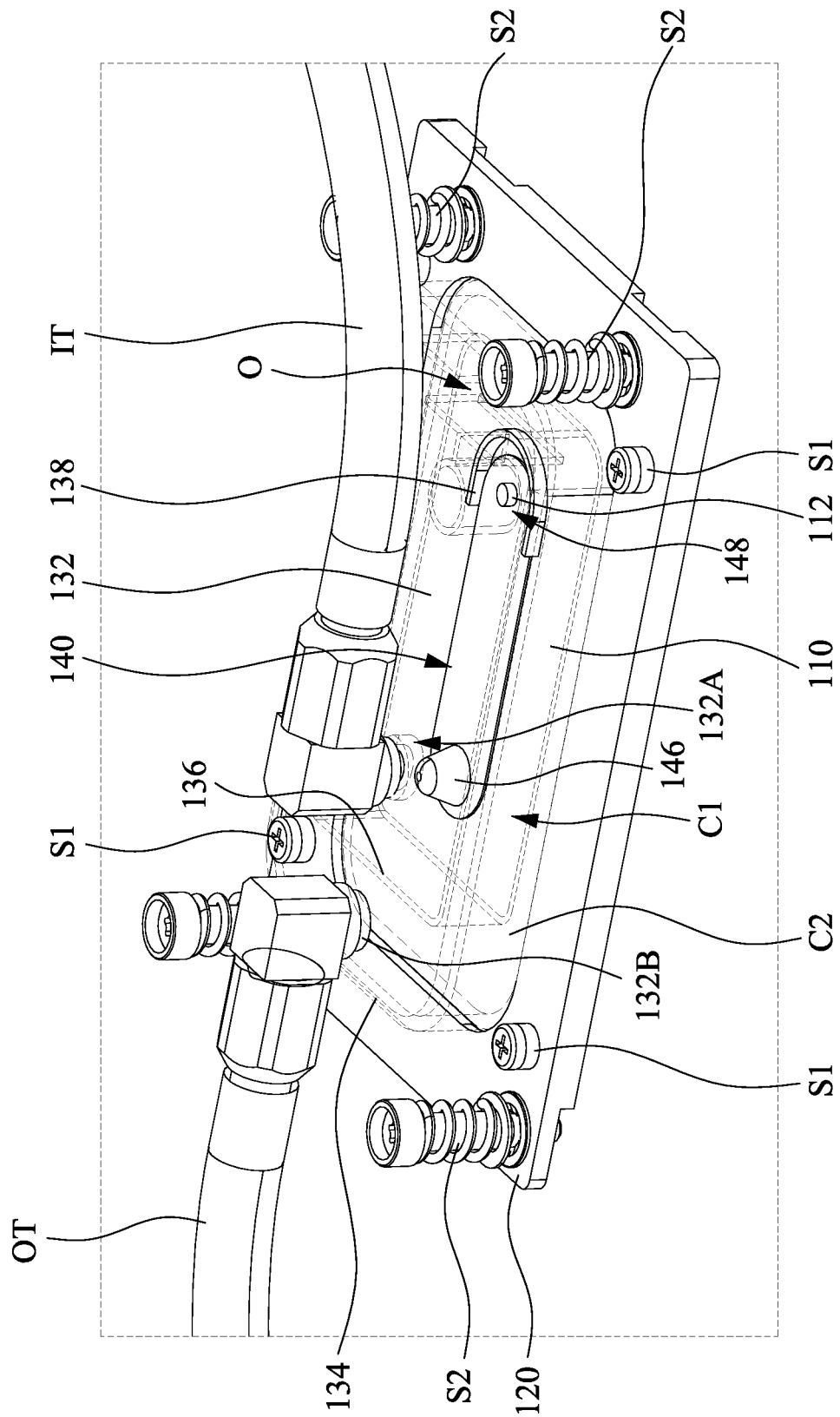
FIG. 8 shows a schematic view of a stop portion separated from a liquid inlet hole, in accordance with an embodiment of present disclosure.

Reference is made to FIG. 7 and FIG. 8. FIG. 7 and FIG. 8 show how the temperature control element 140 operates to control the flow rate of the cooling liquid in the cooling liquid flow control device 100. Since the temperature control element 140 is substantially composed of two metal strips attached to each other (for example, bimetallic strips), and the temperature control element 140 is substantially immersed in the cooling liquid, so the temperature control element 140 can cause deformation based on the temperature of cooling liquid. In more detail, when the temperature of the cooling liquid is lower than a temperature threshold, the temperature control element 140 will bend toward a side of the metal strip having a larger coefficient of thermal expansion. When the temperature of the cooling liquid is higher than the temperature threshold, the temperature control element 140 will bend toward a side of the metal strip with the smaller coefficient of thermal expansion. By this feature, the temperature control element 140 can cause the deformation based on the temperature of the cooling liquid, and to clog and be separated from the liquid inlet hole 132A through the stop portion 146 disposed on the temperature control element 140, so as to achieve the purpose of controlling the flow rate of the cooling liquid.

In the cooling liquid flow control device 100 of the present disclosure, as shown in FIG. 7, when the temperature of the cooling liquid is lower than the temperature threshold, the temperature control element 140 bends toward a side of the second metal strip 144, causing the stop portion 146 clogs the liquid inlet hole 132A so as not to communicate the liquid inlet pipe IT and the first sub-cavity C1. In a usage scenario, when the heating element located under the heat dissipation bottom plate 110 and in contact with the bottom surface 110b generates a relatively little amount of waste heat due to being in an idle state, the temperature of the cooling liquid is lower than the temperature threshold, and the temperature control element 140 bends upward (as shown in FIG. 7) to clog the liquid inlet hole 132A. Since the stop portion 146 clogs the entire liquid inlet hole 132A, the cooling liquid from the liquid inlet pipe IT cannot temporarily enter the first sub-cavity C1 through the liquid inlet hole 132A.

In the cooling liquid flow control device 100 of the present disclosure, as shown in FIG. 8, when the temperature of the cooling liquid is higher than the temperature threshold, the temperature control element 140 bends toward a side of the first metal strip 142, causing the stop portion 146 is separated from the liquid inlet hole 132A to communicate the liquid inlet pipe IT and the first sub-cavity C1. In a usage scenario, when the heating element located under the heat dissipation bottom plate 110 generates a relatively large amount of waste heat due to being in a full load state and, the temperature of the cooling liquid is higher than the temperature threshold, and the temperature control element 140 bends downward (as shown in FIG. 8) to be separated from the liquid inlet hole 132A. Since the stop portion 146 is separated from the liquid inlet hole 132A, the cooling liquid from the liquid inlet pipe IT can enter the first sub-cavity C1 through the liquid inlet hole 132A. As shown in FIG. 8, the maximum extent that the temperature control element 140 bends toward a side of the first metal strip 142 is that the extension direction of the temperature control element 140 is parallel to the extension direction of the heat dissipation bottom plate 110 (that is, the temperature control element 140 contacts the top surface 110a of the heat dissipation bottom plate 110 and is parallel thereto).

In the cooling liquid flow control device 100 of the present disclosure, when the temperature of the cooling liquid is between the temperature of the cooling liquid in the embodiment of FIG. 7 and the temperature of the cooling liquid in the embodiment of FIG. 8, The temperature control element 140 causes the stop portion 146 partially clogs the liquid inlet hole 132A to communicate the liquid inlet pipe IT and the first sub-cavity C1. In a usage scenario, when the heating element located under the heat dissipation bottom plate 110 is in a partial load state and does not generate that much waste heat in a full load state, so that the temperature of the cooling liquid is lower than that of the cooling liquid in a full load state. The temperature in turn causes the stop portion 146 to clog a part of the liquid inlet hole 132A. Since the stop portion 146 clogs the part of the liquid inlet hole 132A, the cooling liquid from the liquid inlet pipe IT can enter the first sub-cavity C1 through the liquid inlet hole 132A at a relatively low flow rate.

Through the above operations, the cooling liquid flow control device 100 can control the flow rate of the cooling liquid based on the temperature of the cooling liquid in the cavity C, so as to achieve the effect of saving power.

In some embodiments, the temperature control element 140 is substantially disposed in the first sub-cavity C1, but the present disclosure is not limited thereto. In some embodiments, the temperature control element 140 may also be disposed in the second sub-cavity C2.

In some embodiments, the stop portion 146 is disposed near the liquid inlet hole 132A to clog and be separated from the liquid inlet hole 132A, but the present disclosure is not limited thereto. In some embodiments, the stop portion 146 may also be disposed near the liquid outlet hole 132B to clog and be separated from the liquid inlet hole 132A.

In some embodiments, as shown in FIG. 1, FIG. 2, FIG. 6, FIG. 7, and FIG. 8, the fixing element S2 includes elements such as springs and screws, but the present disclosure is not limited thereto. In some embodiments, the fixing element S2 may not include a spring. Although the present disclosure discloses that the fixing holder 120 is connected to the substrate by means of locking, the present disclosure does not intend to limit the structure, method, or means for connecting the fixing holder 120 to the substrate.

In some embodiments, as shown in FIG. 1, FIG. 2, FIG. 5, FIG. 7, and FIG. 8, the fixing element S1 is substantially a screw. Although the present disclosure discloses that the heat dissipation bottom plate 110 and the fixing holder 120 are connected to each other by means of locking (for example, the heat dissipation bottom plate 110 and the fixing holder 120 are locked to each other through the fixing element S1), the present disclosure does not intend to limit the structure, method or means of connecting heat dissipation bottom plate 110 and the fixing holder 120 to each other.

In some embodiments, the composition of the cooling liquid may be liquid water ($H_2O$), but the present disclosure is not limited thereto. In some embodiments, the composition of the cooling liquid may be ethylene glycol ($C_2H_6O_2$) or propylene glycol ($C_3H_8O_2$). The above is merely an example for simple description, and the present disclosure does not intend to limit the composition of the cooling liquid.

In some embodiments, the heat dissipation bottom plate 110 and the cooling module 130 are substantially separated from each other, but the present disclosure is not limited thereto. In some embodiments, the heat dissipation bottom plate 110 and the cooling module 130 may be integrally formed rather than separately provided. For example, the heat dissipation bottom plate 110 and the cooling module 130 can be integrally formed into a water-cooling case body with a cavity C.

In some embodiments, the heat dissipation bottom plate 110 and the cooling module 130 are substantially tightly connected. Alternatively, in some embodiments, the heat dissipation bottom plate 110 and the cooling module 130 may be adhesively connected to each other. Alternatively, in some embodiments, the heat dissipation bottom plate 110 and the cooling module 130 may be buckled and connected to each other. The foregoing is merely examples for simple description, and the present disclosure does not intend to limit the structure, method, or means of connecting the heat dissipation bottom plate 110 and the cooling module 130 to each other.

In some embodiments, the first metal strip 142 and the second metal strip 144 may be a combination of metal materials such as copper/aluminum or copper/stainless steel. The present disclosure does not intend to limit the material combination of the first metal strip 142 and the second metal strip 144. It should be noted that the material combination of the first metal strip 142 and the second metal strip 144 must also consider whether it will chemically react with the cooling liquid to cause rust or damage to the temperature control element 140.

In some embodiments, the temperature control element 140 may include at least two metal strips with different coefficient of thermal expansions.

In some embodiments, the stop portion 146 may be a flexible material such as plastic, rubber, or cork to clog the liquid inlet hole 132A more tightly. The foregoing is only an example for simple description, and the present disclosure does not intend to limit the material of the stop portion 146.

In some embodiments, one end of the temperature control element 140 may be fixed to the pressing block 138. For example, the pressing block 138 may have a downwardly extending bump passing through the positioning hole 148 to position the temperature control element 140. In the embodiment in which the pressing block 138 has a bump, the heat dissipation bottom plate 110 does not include the positioning column 112. The present disclosure does not intend to limit the position where the temperature control element 140 is disposed on the inner surface of the cavity C.

In some embodiments, the temperature control element 140 may be locked to the inner surface of the cavity C. Alternatively, in some embodiments, the temperature control element 140 may be adhered to the inner surface of the cavity C. Alternatively, in some embodiments, the temperature control element 140 may be buckled on the inner surface of the cavity C. The present disclosure does not intend to limit the structure, method, or means for the temperature control element 140 to connect to the inner surface of the cavity C.

From the above detailed description of the specific embodiments of the present disclosure, it can be clearly seen that in the cooling liquid flow control device of the present disclosure, since the temperature control element utilizes the characteristics of bimetallic strip generating deformation based on the temperature of the cooling liquid, the stop portion of the temperature control element can clog, partially clog, or be separated from the liquid inlet hole to achieve the purpose of controlling the flow rate of the cooling liquid. In the cooling liquid flow control device of the present disclosure, since the bimetallic strip is used as the material of the temperature control element, it can not only achieve the power saving effect of the cooling liquid flow control device, but also effectively reduce the installation space of the liquid cooling device.

In an embodiment of the present disclosure, the cooling system of the present disclosure can be applied to a server, which can be used for artificial intelligence (AI) computing, edge computing, or used as a 5G server, cloud server or vehicle networking server.

Although the present disclosure has been disclosed as above in the embodiment manner, it is not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A cooling liquid flow control device, comprising:
a heat dissipation bottom plate comprising a bottom surface configured to be in contact with a heating element on a substrate;
a fixing holder connected to the heat dissipation bottom plate and configured to be fixed with the substrate;
a cooling module connected to a top surface of the heat dissipation bottom plate to form a cavity configured to circulate a cooling liquid;
a temperature control element disposed in the cavity and configured to deform based on a temperature of the cooling liquid in the cavity, thereby adjusting a flow rate of the cooling liquid in and out of the cavity; and
a pressing block extends from a top plate of the cooling module and configured to press against the temperature control element disposed in the cavity.

2. The cooling liquid flow control device of claim 1, wherein the cooling module comprises a liquid inlet pipe and a liquid outlet pipe, and the cavity further comprises:
a first sub-cavity configured to receive the cooling liquid from the liquid inlet pipe; and
a second sub-cavity surrounding the first sub-cavity and configured to deliver the cooling liquid from the first sub-cavity to the liquid outlet pipe.

3. The cooling liquid flow control device of claim 2, wherein an opening is between the first sub-cavity and the second sub-cavity, and the opening allows the cooling liquid to circulate between the first sub-cavity and the second sub-cavity.

4. Wherein the cooling module further comprises:
the top plate having a liquid inlet hole and a liquid outlet hole, wherein the liquid inlet hole connects the liquid inlet pipe and the first sub-cavity, and the liquid outlet hole connects the liquid outlet pipe and the second sub-cavity;
an outer surrounding wall extending vertically from an edge of the top plate and surrounding the edge of the top plate, wherein the outer surrounding wall is connected to the heat dissipation bottom plate; and
an inner surrounding wall extending vertically from the top plate and surrounded by the outer surrounding wall, wherein the inner surrounding wall is connected to the heat dissipation bottom plate.

5. The cooling liquid flow control device of claim 4, wherein the opening is located on the inner surrounding wall.

6. The cooling liquid flow control device of claim 4, wherein the temperature control element comprises:
a first metal strip having a first coefficient of thermal expansion; and
a second metal strip attached to the first metal strip and having a second coefficient of thermal expansion, wherein the first coefficient of thermal expansion is less than the second coefficient of thermal expansion.

7. The cooling liquid flow control device of claim 6, wherein the temperature control element further comprises a stop portion disposed on the second metal strip, and the stop portion is configured to clog and be separated from the liquid inlet hole.

8. The cooling liquid flow control device of claim 7, wherein an end of the temperature control element away from the stop portion is connected to an inner surface of the cavity.

9. The cooling liquid flow control device of claim 7, wherein the temperature control element is configured to:
bend toward a side of the second metal strip when the temperature of the cooling liquid is lower than a temperature threshold, so that the stop portion clogs the liquid inlet hole so as not to communicate the liquid inlet pipe and the first sub-cavity.

10. The cooling liquid flow control device of claim 7, wherein the temperature control element is configured to:
bend toward a side of the first metal strip when the temperature of the cooling liquid is higher than a temperature threshold, so that the stop portion is separated from the liquid inlet hole to communicate the liquid inlet pipe and the first sub-cavity.

* * * * *